United States Patent
Shibata et al.

[11] Patent Number: 6,011,714
[45] Date of Patent: Jan. 4, 2000

[54] SEMICONDUCTOR CIRCUIT CAPABLE OF STORING A PLURALITY OF ANALOG OR MULTI-VALUED DATA

[75] Inventors: Tadashi Shibata, 5-2, Nihondaira, Taihaku-ku, Sendai-shi, Miyagi-ken 982-02; Tadahiro Ohmi, 1-17-301, Komegabukuro 2-chome Aoba-ku, Sendai-shi, Miyagi-ken 980; Yuichiro Yamashita, Miyago-ken, all of Japan

[73] Assignees: Tadashi Shibata; Tadahiro Ohmi, both of Miyagi-ken, Japan

[21] Appl. No.: 09/019,270

[22] Filed: Feb. 5, 1998

[30] Foreign Application Priority Data

Feb. 6, 1997 [JP] Japan ................................ 9-024063
Feb. 2, 1998 [JP] Japan ................................ 10-021173

[51] Int. Cl.$^7$ .................................................. G11C 11/34
[52] U.S. Cl. ................................ 365/185.03; 365/185.2; 365/185.22
[58] Field of Search .......................... 365/185.03, 185.2, 365/185.22

[56] References Cited

U.S. PATENT DOCUMENTS

| 5,712,815 | 1/1998 | Bill et al. ............................ 365/185.03 |
| 5,768,184 | 6/1998 | Hayashi et al. ..................... 365/185.03 |

FOREIGN PATENT DOCUMENTS

| 60-68654 | 4/1985 | Japan ............................. H01L 29/78 |
| WO 90/13912 | 11/1990 | Japan ........................... H01L 21/316 |
| 3-6679 | 1/1991 | Japan ............................. G06F 15/82 |
| WO 92/16971 | 1/1992 | Japan ........................... H01L 29/788 |
| 5-335506 | 12/1993 | Japan ............................. H01L 27/10 |
| 5-335656 | 12/1993 | Japan ............................. H01L 49/00 |
| WO 93/24958 | 12/1993 | Japan ............................. H01L 27/10 |
| 6-53431 | 2/1994 | Japan ............................. H01L 27/10 |
| 6-77427 | 3/1994 | Japan ............................. H01L 27/10 |
| 6-112427 | 4/1994 | Japan ............................. H01L 27/10 |
| 6-139380 | 5/1994 | Japan ............................. G06G 7/60 |
| 6-244375 | 9/1994 | Japan ............................. H01L 27/10 |
| 6-250994 | 9/1994 | Japan ............................. G06F 15/18 |
| 6-252744 | 9/1994 | Japan ............................. H03K 19/21 |
| 07153924 | 6/1995 | Japan ............................. H01L 27/10 |
| 07161942 | 6/1995 | Japan ............................. H01L 27/10 |
| WO 95/20268 | 7/1995 | Japan ........................... G03K 19/094 |
| 07200513 | 8/1995 | Japan ............................. G06F 15/18 |
| 07211084 | 8/1995 | Japan ............................. G11C 11/56 |
| 07226085 | 8/1995 | Japan ............................. G11C 11/56 |
| 07226912 | 8/1995 | Japan ............................. H04N 5/907 |
| WO 95/22145 | 8/1995 | Japan ............................. G11C 11/56 |
| 08084062 | 3/1996 | Japan ........................... H03K 19/0175 |
| 08195091 | 7/1996 | Japan ............................. G11C 16/06 |
| 08221504 | 8/1996 | Japan ............................. G06G 7/60 |
| 08274197 | 10/1996 | Japan ............................ H01L 21/8247 |
| WO 96/30853 | 10/1996 | Japan ............................ G06G 7/12 |
| WO 96/30854 | 10/1996 | Japan ............................ G06G 7/12 |
| WO 96/30855 | 10/1996 | Japan ............................ G06G 7/60 |
| WO 96/30948 | 10/1996 | Japan ............................ H01L 29/788 |
| 09244875 | 9/1997 | Japan ............................. G06F 7/50 |
| 09245110 | 9/1997 | Japan ............................. G06G 7/60 |

*Primary Examiner*—David Nelms
*Assistant Examiner*—Hoai V. Ho
*Attorney, Agent, or Firm*—Randall J. Knuth

[57] ABSTRACT

A semiconductor circuit assembly is capable of accurately storing a plurality of analog or multi-valued data using circuitry having a small surface area. The circuit assembly includes a first circuit provided in the form of a target memory cell device comprising memory cells which conduct the writing and storage of analog signals. The first circuit has output terminals for outputting stored values to the exterior as voltage signals. Mechanisms supply at least two index voltages. A second circuit performs the function of halting the writing of the analog signals when the output signal at the first circuit output terminals reaches a value representing a desired voltage plus the difference between the two index voltages.

13 Claims, 4 Drawing Sheets

SEMICONDUCTOR CIRCUIT CAPABLE OF STORING A PLURALITY OF ANALOG OR MULTI-VALUED DATA

BACKGROUND OF THE INVENTION AND DESCRIPTION OF RELATED ART

1. Field of the Invention

The present invention relates to a semiconductor circuit, and in particular, relates to the highly accurate storing of a plurality of analog or multi-valued data using a circuit having a small surface area.

2. Background Art

In recent years, in concert with developments in computer technology, there has been striking progress in data processing technology. However, when attempts have been made to realize the flexible type of data processing conducted by human beings, it has almost been impossible to produce real time operating effects using present-day computers. The reason for this is that the data which we deal with in our everyday lives are analog data, so that firstly, there is enormous amount of such data, and moreover, these data are imprecise and uncertain. The conversion of such enormous amounts of analog data to digital values, and the conducting of extremely strict digital operations datum by datum, is a problem for present-day data processing systems.

An example of this is that of image data. For example, if a single screen is incorporated into a 500×500 two dimensional pixel array, then the number of pixels reaches a total of 250,000, and if the strength of the three colors red, green and blue is expressed in eight-bit format for each pixel, then 750,000 bits are required for one static image. In the case of moving images, the amount of image data increases with time. Even if present-day super computers are employed, it is impossible to manipulate the enormous amount of data having values of '1' and '0' and to conduct recognition and analysis of the screens in real time.

In order to overcome these difficulties, efforts have been made to realize data processing more closely approximating that of human beings by means of accepting analog real world data in an unchanged manner and conducting operations and processing in the analog format. As a result, a number of memory devices have been invented. One of these is the memory device shown in FIG. 2, which is capable of writing desired analog values using simple control circuitry (see FIG. 6 of Japanese Patent Application No. HEI 7-29443).

Although this memory is capable of realizing accurate writing using simple control, it has the drawback that the setting of the reference voltages applied to the control circuit is difficult.

The reason for this is as follows. In conventional control circuitry, a writing target value is first applied as a reference value, and when the subsequent input is equal to the reference value, the output changes logically from a LO state to a HI state. When this kind of control circuitry is used to conduct writing, the following things occur. During writing, terminal 201 is grounded, and a high voltage is applied to terminal 202, and thereby electrode 203 is set to a high voltage, and thereby Fowler-Nordheim current flows in the thin oxide film portion 204, and electrons are drawn away from floating gate 205. The voltage of the floating gate is read out via source follower 206 in a time continuous manner, and is monitored by the control circuitry. The floating gate is strongly drawn to the ground potential by terminal 201, so that an increase in the voltage of the floating gate as a result of the high voltage can be ignored, and changes in the voltage resulting from the movement of charge, that is to say, only that voltage which was written, is monitored by the control circuitry. When the output from the memory is equal to the writing target value, the control circuitry outputs a HI state, and a switch comprising MOS type transistors is placed in an ON state. At this time, the potential of electrode 203 is set to the ground potential, and the writing is completed. The data are read out by grounding electrode 203. During writing, when the values become equal to the reference voltage, that is to say, to the writing target value, writing is halted, so that the value in the memory read out after writing is in agreement with the writing target value. In principle, writing is conducted in this manner, and it is possible to write the values desired; however, in actuality, the ratio of the capacity $C_1$, between the terminal 201 and the floating gate, and the capacity $C_2$, between the floating gate and the thin oxide film, is limited, and when electrode 203 reaches a high voltage, the voltage of the floating gate increases even though absolutely no writing is being conducted, and an offset is produced.

During writing, a voltage representing a combination of the offset and the writing into the floating gate as a result of charge transfer is read out via the source follower, and writing ceases when this becomes equal to the writing target value. During readout, this offset is not produced. Accordingly, during readout, a voltage representing the writing target value less the offset is read out via the source follower.

In conclusion, if a simple comparator is used as the control circuitry, the desired voltage can not be written into the memory cell. In order to conduct accurate writing, it is necessary to estimate the offset in advance in creating the reference voltage. In principle, the offset voltage is determined by the capacity ratio of $C_1$ and $C_{tun}$, and the high voltage applied. If a reference value in which this value is added to the writing target value is employed, a value equal to the writing target value from which the offset has been subtracted is obtained after writing as the output result. However, as a result of fluctuations in the film thickness and the working dimensions during manufacture, the capacity ratio varies somewhat from the designed value. When the designed offset value is added to the writing target value in a state in which such variation has occurred, this itself leads to fluctuations and writing errors. Accordingly, it is impossible to conduct highly accurate writing.

SUMMARY AND PURPOSE OF THE INVENTION

The present invention was designed in light of the above circumstances; it has as an object thereof to provide a semiconductor circuit which is capable of storing a plurality of analog and multi-valued data in a highly accurate manner using circuitry having a small surface area.

The present invention is provided with at least: a first circuit, having memory cells which conduct the writing and storage of analog signals, and which possess output terminals which output the stored values to the exterior as voltages; mechanisms for supplying at least two index voltages; and a second circuit, which has the function of halting the writing of the analog signals when the output from the output terminals equals the value of a desired voltage plus the difference between the two index voltages.

In accordance with the present invention, it is possible to provide a semiconductor circuit which is capable of storing a plurality of analog and multi-valued data in a highly accurate manner using circuitry having a small surface area.

BRIEF DESCRIPTION OF THE DIAGRAMS

Description of the References

| | |
|---|---|
| 101 | circuit for controlling writing, |
| 102 | dummy memory cell, |
| 103 | target memory cell, |
| 104 | index voltage generating circuit, |
| 105 | capacity $C_1$, |
| 106 | capacity $C_{tun}$, |
| 107 | capacity $C_2$, |
| 108, 109 | switches, |
| 110 | control circuit input, |
| 111, 112 | switches, |
| 113 | reference voltage input terminal, |
| 114 | capacity, |
| 115 | amplifier |

DETAILED DESCRIPTION OF THE PREFERRED EMBODIMENTS OF THE INVENTION

Figure 1:
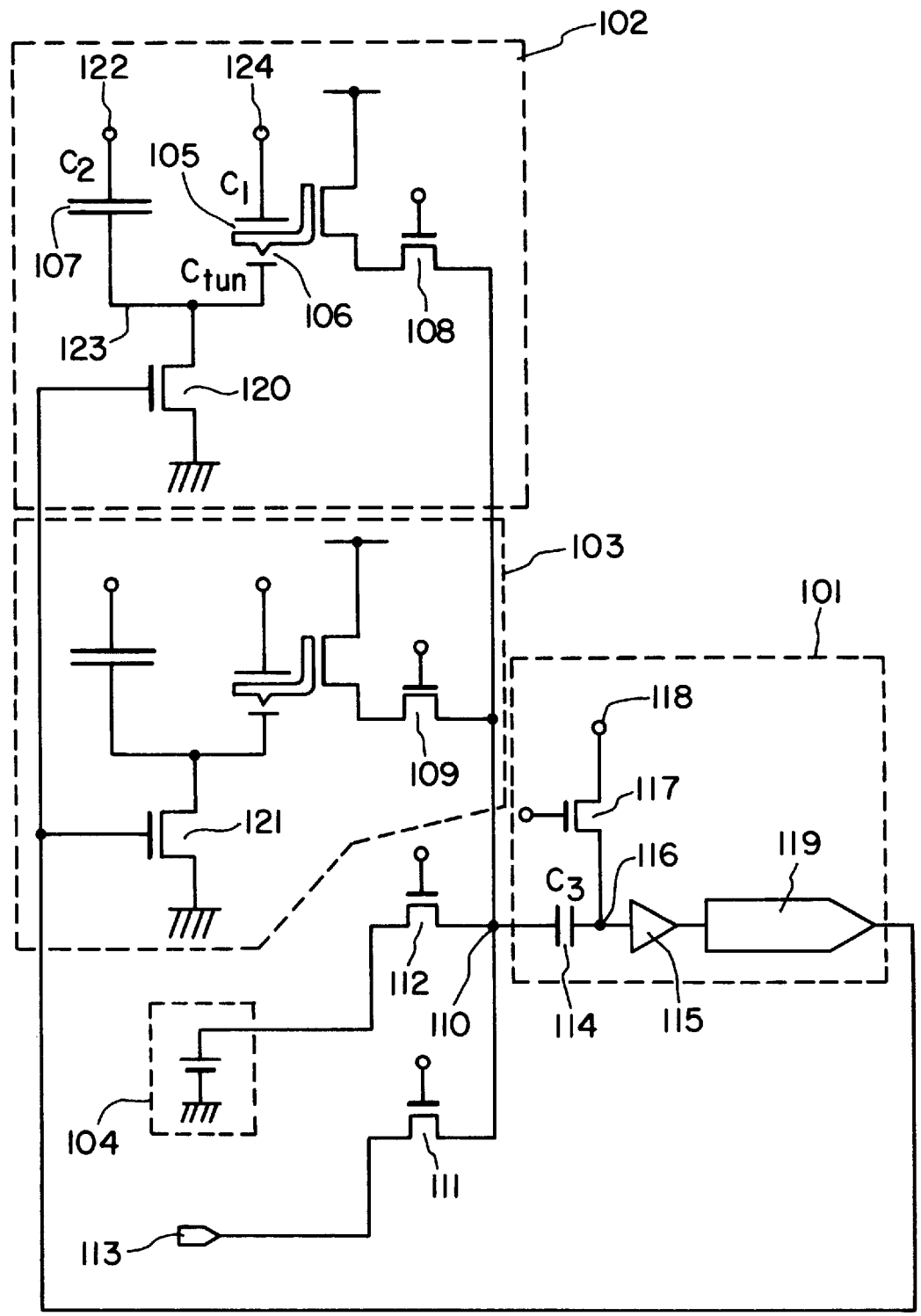
FIG. 1 is a circuit diagram showing an example of a semiconductor circuit in accordance with the present invention.
Figure 2:
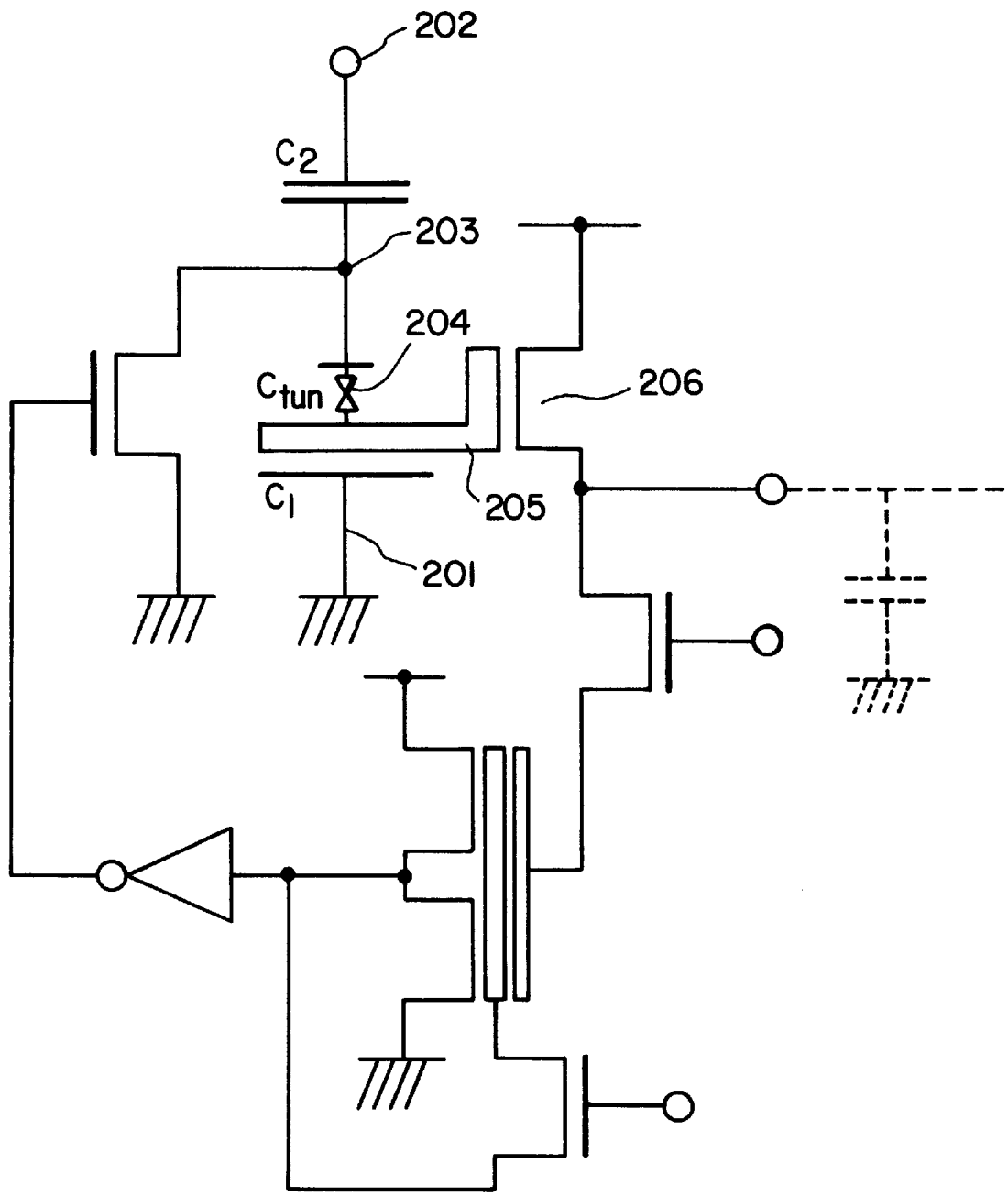
FIG. 2 shows a conventional control circuit.

FIG. 1 shows a first embodiment. Reference 101 indicates a circuit which controls writing, reference 102 indicates a memory cell serving as a dummy which serves to cancel the offset, and reference 103 indicates a target memory cell into which writing is actually to be conducted. Furthermore, reference 104 indicates a index voltage generating circuit which generates 2.0 V in a highly accurate manner. Memory cells 102 and 103 are adjacent to one another, and the design structure thereof is completely identical. These have capacities $C_1$ at 105, $C_{tun}$ at 106, and $C_2$ at 107. The output of memory cells 102 and 103 is connected to a common output line via, respectively, selecting switches 108 and 109. The common output line is connected to the input 110 of the control circuit, and the outputs of reference voltage input terminal 113 and index voltage generating circuit 104 are connected to input 110 via, respectively, switches 111 and 112. The first stage of the control circuit is connected to an amplifier 115 having the input and output characteristics:

$$V_{OUT}=F(V_{IN})$$

(where $V_{OUT}$ represents the output voltage and VIN represents the input voltage) via capacitor 114 having a value of $C_3$, and the input 116 thereof is connected to terminal 118 via a switch 117. The voltage of terminal 118 is fixed at the threshold voltage $V_{INV}$ of the amplifier 115. The output of the amplifier is inputted into a chopper type comparator 119 which amplifies the output by the gain stage. Circuit 101 is designed so as to logically output a HI state when the input voltage exceeds the reference voltage; when the input voltage exceeds the reference voltage, the switch MOS transistors 120 and 121 are made to conduct.

Before writing is conducted into the target cell, writing is first conducted into the dummy cell. At this time, as explained below, the function of control circuit 101 is identical to that which was the case conventionally: it serves to output a HI state when a value equal to the stored reference value is inputted. First, 2.0 V is applied to the control circuit from index voltage generating circuit 104 via switch 112. In this state, switch 117 enters an ON state, and amplifier 115 is biased at the threshold voltage. After this, when switch 117 enters an OFF state, the input part 116 of the amplifier is placed in an electrically floating state, and in the state in which 2.0 V is inputted, the amplifier stores the fact that it is biased at the threshold voltage. By storing the output voltage of the amplifier 115, into which the threshold voltage is applied as an input, in chopper type comparator 119, the control circuit as a whole is initially set so as to output the HI state when an input of 2.0 V is accepted. After this initial setting is conducted, writing is conducted into the memory cell. When a high voltage $V_{pp}$ for writing is applied to the high voltage application terminal 122 of dummy cell 102, the capacity $C_2$ has a sufficiently large value in comparison with the other two capacities, so that the voltage of tunnel electrode 123 also becomes $V_{pp}$. When absolutely no Fowler-Nordheim current flows, the voltage $V_{fg}$ of the floating gate is given by the following formula:

$$V_{fg}=\{C_{tun}/(C_1+C_{tun})\}\cdot V_{pp}$$

This is the conventionally produced offset. Here, terminal 124 is grounded. The floating gate voltage during writing is a value representing an overlay of the actually written value on the offset as a result of charge transfer. If the threshold value of the source follower is assumed to be 0 V, and it is assumed that the gate voltage is outputted to the source in an unaltered manner, then the written value $V_{wr}$ will fulfill the following formula:

$$2.0[V]=V_{wr}+\{C_{tun}/(C_1+C_{tun})\}\cdot V_{pp}$$

and the control circuit outputs a HI state, and writing is halted. When this value is read out, the offset effect disappears, and only $V_{wr}$ appears, so that the following results:

$$V_{wr}=2.0-\{C_{tun}/(C_1+C_{tun})\}\cdot V_{pp}$$

and a value resulting from the subtraction of the offset from 2.0 V is written. This is identical to the conventional writing.

Next, the index voltage generating circuit 104 and the output $V_{dum}$ of dummy cell 102 are used as the two index voltages, and writing is conducted into the target cell 103. Here, the function of the control circuit is changed. When conventional writing, and writing into the dummy cell, were conducted, writing was halted when the voltage stored as the reference voltage and the output of the memory cell during writing became equal; however, in order to write the desired value, it was necessary to add a voltage, in which the offset voltage was added to the writing target value, to the reference value. That is to say, it was necessary to add the following value as the reference voltage $V_{ref}$:

$$V_{ref}=\text{writing target voltage}+\{C_{tun}/(C_1+C_{tun})\}\cdot V_{pp}$$

Here, the offset voltage is such that, from the output $V_{wr}$ of the dummy cell and the output 2.0 V of the index voltage generating circuit 104 used during writing into the dummy cell, the following relationship is satisfied:

$$\{C_{tun}/(C_1+C_{tun})\}\cdot V_{pp}=2.0-V_{wr}$$

That is to say, the reference value was applied to the control circuit as follows:

$V_{ref}$=writing target voltage+2.0−$V_{wr}$ and writing may be halted when the output $V_{out}$ of the memory satisfies the following conditions:

$V_{out}=V_{ref}$=writing target voltage+2.0−$V_{wr}$

Such functions are realized using control circuit 101.

The relationship between the memory output and the reference value described above can be transformed into the following relationship:

$V_{out}$−writing target voltage=2.0−$V_{wr}$

That is to say, the consequence is that using the control circuitry, control may be conducted wherein the HI state is outputted when the difference between the two voltages has become equal. Hereinbelow, this operation will be explained. First, switch 108 is placed in an ON state, and $V_{wr}$ is applied to the input of the control circuit. In this state, switch 117 is placed in an ON state, electrode 116 is given the voltage $V_{INV}$, and switch 117 is placed in an OFF state. Next, switch 112 is placed in an ON state, and the output 2.0 of the index voltage generating circuit 104 is inputted into the control circuit. When this is done, the voltage of electrode 116 of the input portion is as follows:

$V_{INV}+\{C_3/(C_3+C_{in})\}\cdot(2.0-V_{wr})$

Here, $C_{in}$ represents the input capacity of amplifier 115. This voltage is outputted in accordance with the input and output characteristics of amplifier 115, and the following voltage is outputted:

$F(V_{INV}+\{C_3/(C_3+C_{in})\}\cdot(2.0-V_{wr})$

This value is stored by the comparator, and the comparator outputs the HI state as the control circuit when a value equivalent to the voltage given by the formula above is subsequently inputted.

Next, switch 111 is placed in an ON state, and a target voltage $V_{tar}$ which is to be written is applied from the exterior. In this state, switch 117 is turned ON and then turned OFF, and then switch 109 is placed in an ON state, and output from the memory is accepted. In this state, the voltage of electrode 116 is $V_{INV}+\{C_3/(C_3+C_{in})\}\cdot(V_{out}-V_{tar})$ and the output of amplifier 115 is given by $F(V_{INV}+\{C_3/(C_3+C_{in})\}\cdot(V_{out}-V_{tar}))$ In this state, a high voltage is applied to the writing electrode 123 of memory cell 103. The comparator halts the writing when the following conditions are fulfilled:

$F(V_{INV}+\{C_3/(C_3+C_{in})\}\cdot(2.0-V_{wr}))=F(V_{INV}+\{C_3/(C_3+C_{in})\}\cdot(V_{out}-V_{tar}))$ This is equivalent to the following conditions:

$2.0-V_{wr}=V_{out}-V_{tar}$ or in other words, $V_{out}=V_{tar}+2.0-V_{wr}$ and this meets the conditions for writing of the value which is to be written. In this way, the offset can be calculated by the comparator itself, and canceled, from the two index voltage generating circuits: the index voltage generating circuit within the circuitry and the dummy cell.

Figure 3:
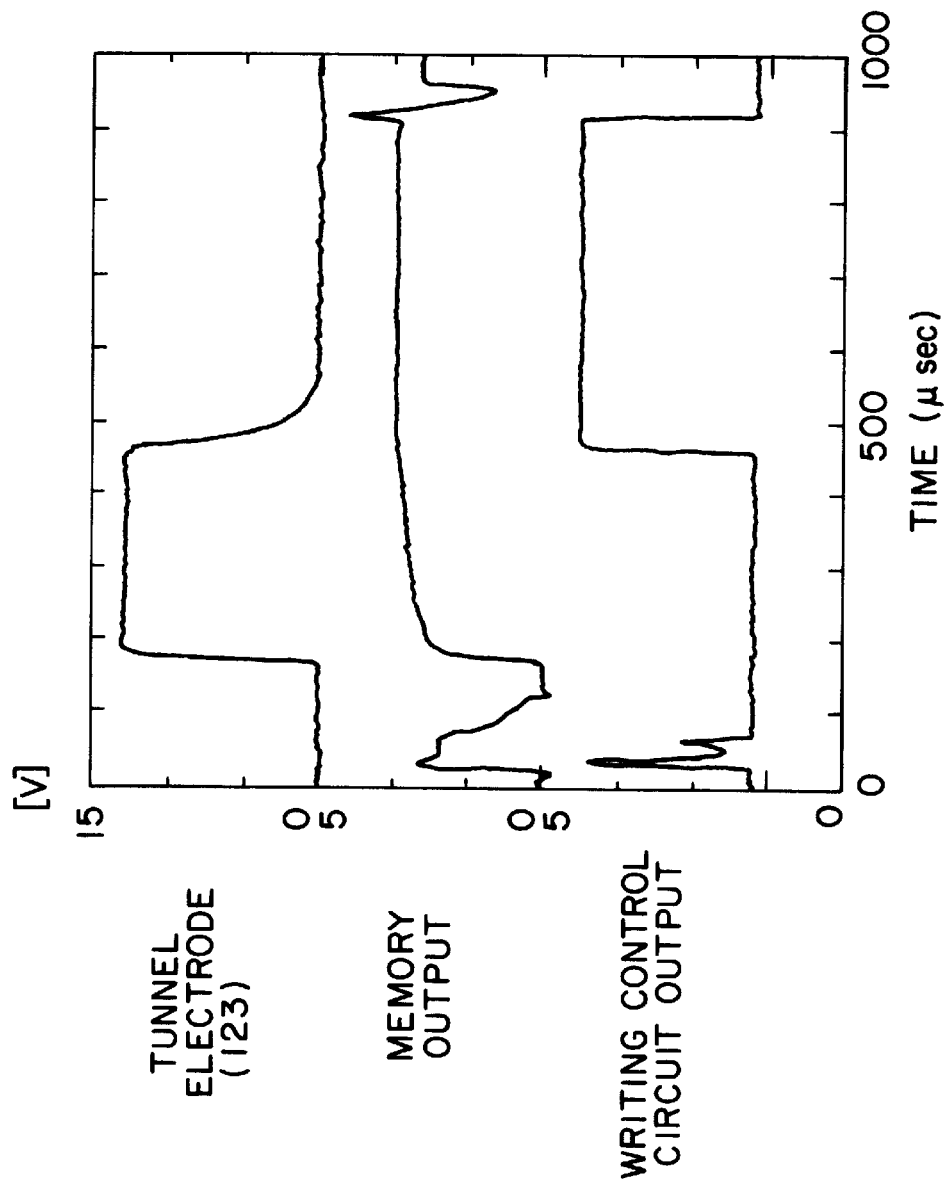
FIG. 3 is a graph showing the measured wave forms of the tunnel electrode potential, the memory output, and the writing control circuit output during writing in the semiconductor circuit of an embodiment.
Figure 4:
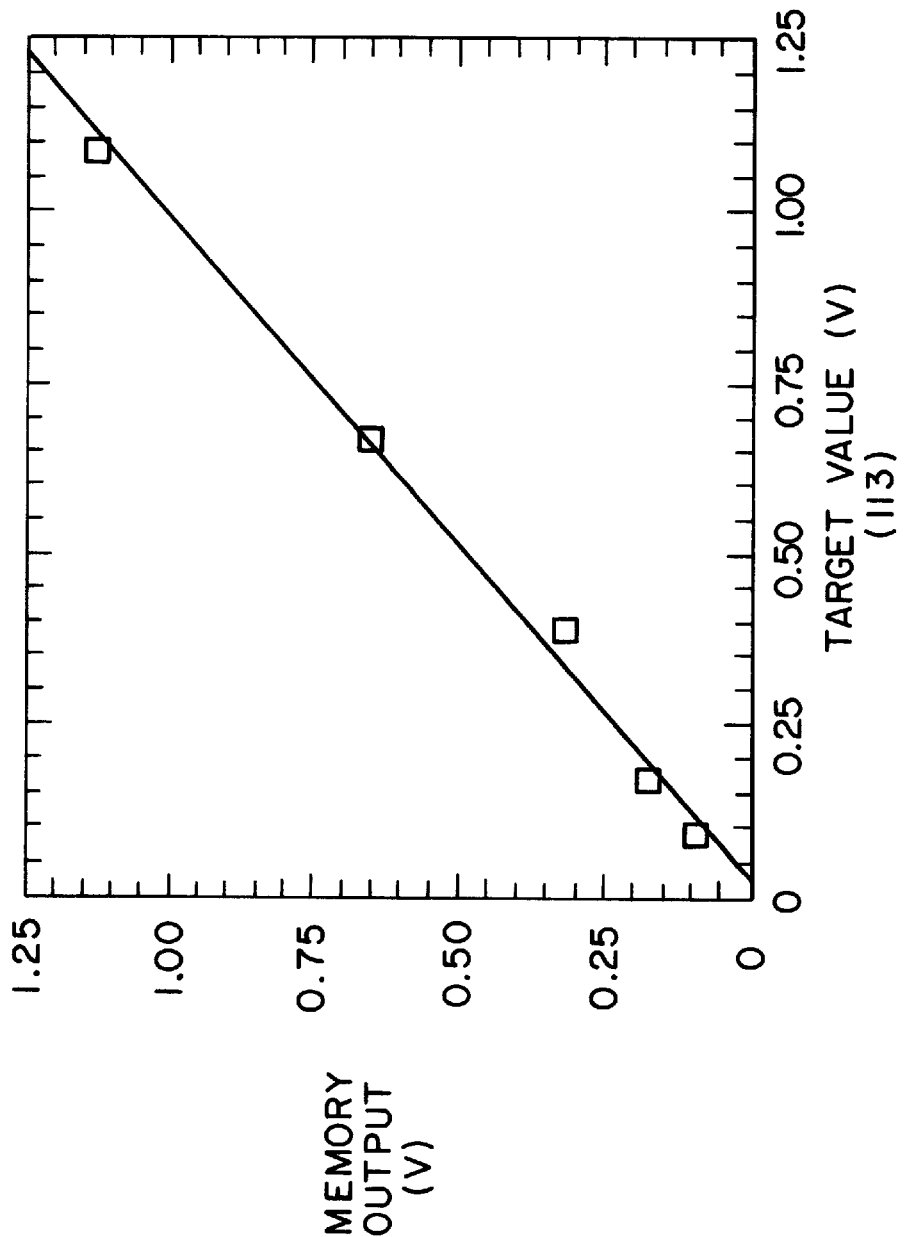
FIG. 4 is a graph showing the relationship between the measured value of the memory output and the writing target value.

With respect to the circuitry of the present embodiment, the results of a measurement of the potential of the tunnel electrode during writing, the memory output, and the output of the writing control circuit are shown in FIG. 3, while the relationship between the memory output and the writing target value is shown in FIG. 4.

The results of this invention are as follows. Conventionally, in order to cancel the offset, it was necessary to externally add an offset determined by the design values to the writing target voltage, and to apply this as the reference voltage. Now, using a structure in which a further amplifier stage has been added to the standard comparator, a function has been realized which allows for the cessation of the writing of an analog signal when a value is realized which represents an addition of the difference between the two index voltages to a desired voltage. Furthermore, the offset voltage is as follows:

$\{C_{tun}/(C_1+C_{tun})\}\cdot V_{pp}$ and when there is variation in $C_1$ and $C_{tun}$, this variation is reflected in the offset voltage, and this ultimately results in a writing error. By generating the offset voltage using a dummy cell in the vicinity of the memory cell into which writing is to be conducted, the relative variation of C, and $C_{tun}$ can be minimized, the variation in the offset voltage can be reduced, and it possible to realize highly accurate writing.

In this case, a memory cell having the structure indicated by reference 102 was employed; however, the present embodiment is not limited thereto, and a cell which employs a writing method in which hot electrons are generated in the channel of a transistor, or a cell which employs a MOS structure, may be employed without altering the effects of the present invention. This is clearly the case because the effects of the present invention result from the cancellation of undesirable variations in readout values resulting from changes in the high voltage application state during writing and the state during readout, using a control circuit having a structure which is provided with a nearby dummy cell and a further amplifier stage in addition to the standard comparator, and which has the function of halting the writing of the analog signal when the value represents the addition of the difference between the two index voltages to a desired voltage; this effect does not depend on the type of memory cell.

Furthermore, a basic analog non-volatile memory cell having one large capacity $C_3$ per memory cell was employed as the memory cell in the present embodiment; however, this is not necessarily so limited, and it is possible to employ memory cells having plurality of structures in which one $C_3$ is present for a plurality of floating gates, or memory cells having a plurality of structures which provide operational amplifiers for the readout part.

Furthermore, the writing activity may be conducted using Frankel-Poole emission in connection with a non-volatile memory having an MNOS structure.

Furthermore, band gap circuits, or circuits which divide a predetermined voltage over a resistance or capacity and output it, may be employed as the index voltage generating circuit 112. Furthermore, it is possible to apply highly accurate voltages from the exterior. During writing into the dummy cell, and during writing into the target cell, an equal voltage may be supplied, but it should be made clear that the present invention is not restricted to such a method.

Furthermore, the design method of the input and output function of amplifier 115 depends on a difference in voltages. In standard electronic circuits, when a voltage sufficiently far from the threshold voltage is inputted, saturation occurs at the ground voltage or at the power source voltage. When saturation occurs, there is no definite determination as to a voltage which will satisfy the relationship given in the following formula:

$$F(V_{INV}+\{C_3/(C_3+C_{in})\}\cdot(2.0-V_{wr}) = F(V_{INV}+\{C_3/(C_3+C_{in})\}\cdot(V_{out}-V_{tar}))$$

For this reason, it is necessary to design input and output functions which respond to the difference in output between a dummy cell and the output of an index voltage generating circuit. Such a design is simple and can be carried out with no problems.

Furthermore, either an inverting amplifier or a non-inverting amplifier may be employed as amplifier 115. This is because the control circuitry need only output a HI state when the input rises and becomes equal to a reference value, and in order to accomplish this, the logic of the following stage comparator may be altered. Furthermore, when the amplifier is an inverting amplifier, the threshold value may be generated by an auto-zero operation.

Furthermore, a chopper type comparator was used as the comparator in this case; however, this is not necessarily so limited. This is clearly the case because this comparator need only be capable of executing comparisons, and the special features possessed only by a chopper type comparator are not required.

Furthermore, 2.0 V was used as the voltage of the index voltage generating circuit 112; however, this is not necessarily so limited. Any voltage may be employed insofar as the voltage $V_{wr}$, given by the formula $$V_{wr} = \text{index voltage generating circuit output voltage} - \{C_{tun}/(C_1+C_{tun})\}\cdot V_{pp}$$

is contained within the dynamic range of the memory output.

Furthermore, an analog value was considered as the value which was to be written in this case; however, multi-values are also possible. This is clear because multi-values are analog values divided at certain quantization levels, and will ultimately be written in as analog values during writing, so that this represents no change.

We claim:

1. The semiconductor circuit comprises:
    a first circuit provided with memory cells which conduct writing and storage of analog signals and which are provided with output terminals which output stored values to the exterior as voltages;
    means for supplying at least two index voltages; and
    a second circuit which halts writing of said analog signals when output from said output terminals reaches a value representing an addition of the difference between each said two index voltages to a desired voltage.

2. The semiconductor circuit in accordance with claim 1, wherein, the writing of said first circuit is conducted using a Fowler-Mordheim current with respect to a non-volatile memory having a floating gate structure comprising at least one MOS type transistor.

3. The semiconductor circuit in accordance with claim 1 wherein, the writing of said first circuit is conducted using channel-hot-electrons with respect to a non-volatile memory having a floating gate structure comprising at least one MOS type transistor.

4. The semiconductor circuit in accordance with claim 1 wherein, the writing of said first circuit is conducted using Frankel-Poole emission with respect to a non-volatile memory having an MNOS structure.

5. The semiconductor circuit in accordance with claim 1 wherein, one of said means for supplying at least two index voltages, a circuit is employed identical to said memory cells which conduct writing and storage of said analog signals, and which have output terminals which output stored values to the exterior as voltages.

6. The semiconductor circuit in accordance with claim 1 wherein, one of said means for supplying at least two index voltages, a circuit is employed which generates a signal dividing a power source voltage.

7. The semiconductor circuit in accordance with claim 1 wherein, one of said means for supplying at least two index voltages, a band gap reference circuit is employed.

8. The semiconductor circuit in accordance with claim 1 wherein, one of said means for supplying at least two index voltages, a predetermined voltage is applied from the exterior.

9. The semiconductor circuit in accordance with claim 1 in which said second circuit, includes a first electrode which is connected with an input of said second circuit via a capacitor, a second electrode which is connected with said first electrode via a switch, a first amplifier, which has said first electrode as an input thereof, and a third circuit, which has an output of said first amplifier as an input terminal and conducts a comparison of two voltages, and an output of said third circuit forms the output of said second.

10. The semiconductor circuit in accordance with claim 9, wherein, said first amplifier includes an inverting amplifier comprising at least one other MOS type transistor.

11. The semiconductor circuit in accordance with claim 9, wherein, said first amplifier includes a non-inverting amplifier comprising at least one other MOS type transistor.

12. The semiconductor circuit in accordance with claim 9 wherein, said third circuit employs a chopper type comparator comprising at least one other MOS type transistor and capacitor.

13. The semiconductor circuit in accordance with claim 2 wherein, the writing of said first circuit is conducted using channel-hot-electrons with respect to a non-volatile memory having a floating gate structure comprising at least one MOS type transistor.

* * * * *